United States Patent
Kuwabara

[19]

[11] Patent Number: 6,124,635
[45] Date of Patent: Sep. 26, 2000

[54] FUNCTIONALLY GRADIENT INTEGRATED METAL-CERAMIC MEMBER AND SEMICONDUCTOR CIRCUIT SUBSTRATE APPLICATION THEREOF

[75] Inventor: Mitsuo Kuwabara, Tsurugashima, Japan

[73] Assignee: Honda Giken Kogyo Kabushiki Kaisha, Tokyo, Japan

[21] Appl. No.: 09/042,650

[22] Filed: Mar. 17, 1998

[30] Foreign Application Priority Data

| Mar. 21, 1997 | [JP] | Japan | 9-068776 |
| Mar. 25, 1997 | [JP] | Japan | 9-072083 |
| Apr. 3, 1997 | [JP] | Japan | 9-085279 |

[51] Int. Cl.[7] .................................................. H07L 23/08
[52] U.S. Cl. .................................... 257/703; 438/125
[58] Field of Search ............................ 257/703; 438/125

[56] References Cited

U.S. PATENT DOCUMENTS

| 4,540,673 | 9/1985 | Takeda et al. | 501/96 |
| 4,737,416 | 4/1988 | Akoh et al. | 428/469 |
| 4,800,137 | 1/1989 | Okuno et al. | 428/698 |
| 5,096,749 | 3/1992 | Harada et al. | 427/404 |
| 5,284,537 | 2/1994 | Kasori et al. | 156/89 |
| 5,300,322 | 4/1994 | Lowden | 427/255 |
| 5,418,002 | 5/1995 | Paik et al. | 427/96 |
| 5,464,950 | 11/1995 | Horiuchi et al. | 174/256 |
| 5,473,137 | 12/1995 | Queriaud et al. | 219/121.64 |
| 5,654,586 | 8/1997 | Schwarzbauer | 257/701 |
| 5,688,450 | 11/1997 | Ali et al. | 257/703 |
| 5,763,093 | 6/1998 | Casey et al. | 428/469 |

FOREIGN PATENT DOCUMENTS

| 4100145 | 7/1991 | Germany | 257/703 |

*Primary Examiner*—David Hardy

[57] ABSTRACT

A functionally gradient member comprises, in an integrated manner, a ceramic part composition layer having desired insulation performance and thermal conductivity, a metal part composition layer having desired thermal conductivity and electric conductivity, and a composite composition layer disposed at a boundary portion between the ceramic part composition layer and the metal part composition layer and having its composition and physical properties which are gradually changed. Accordingly, the metal and the ceramic are integrated into one unit without providing any joining section to provide the functionally gradient member having high joining reliability and having high thermal conductivity.

5 Claims, 5 Drawing Sheets

FIG. 1A

TEMPERATURE PATTERN FOR SINTERING

FIG. 1B

PRESSURE PATTERN FOR SINTERING

FUNCTIONALLY GRADIENT INTEGRATED METAL-CERAMIC MEMBER AND SEMICONDUCTOR CIRCUIT SUBSTRATE APPLICATION THEREOF

BACKGROUND OF THE INVENTION

1. Field of the Invention

The present invention relates to a functionally gradient member constructed in an integrated manner by a ceramic part composition layer and a metal part composition layer. The present invention also relates to a method for producing the functionally gradient member, and a semiconductor circuit substrate based on the use of the functionally gradient member.

2. Description of the Related Art

In general, the semiconductor circuit is devised such that the semiconductor circuit is carried on a ceramic insulating substrate to efficiently discharge the heat generated in the semiconductor circuit to the outside, in order to stabilize semiconductor characteristics.

Especially, in recent years, it is intended to make large electric power control, high speed switching, and high degree of integration, in which there is a notable tendency to achieve high degree of integration, large capacity, and high frequency of the semiconductor circuit. Therefore, it is demanded to reliably perform heat radiation in order to avoid occurrence of, for example, decrease in circuit performance, runaway control, malfunction, and circuit breakdown which would be caused by the heat generated in the semiconductor circuit. Accordingly, an artifice is devised to braze or solder a heat sink or a heat sink base made of copper or aluminum onto the ceramic insulating substrate.

Specifically, copper is metallized on one surface of the ceramic insulating substrate, and then nickel plating is formed thereon, in order to improve the wettability of solder or the like upon mounting of the semiconductor chip. Copper is metallized in the same manner as described above on the other surface of the ceramic insulating substrate, onto which a heat sink or a heat sink base is joined through nickel plating and solder. Thus, a multiple layered structure is formed as a whole.

The ceramic insulating substrate is required to have high thermal conductivity in order to maintain characteristics of the semiconductor circuit at high levels. Further, the ceramic insulating substrate is required to have insulation property, shielding property, and low dielectric property. On the other hand, the heat sink is also required to have high thermal conductivity. Usually, both of the ceramic insulating substrate and the heat sink are designed to have a thermal conductivity of not less than 150 W/mK and have a coefficient of thermal expansion which is approximate to the coefficient of thermal expansion of the semiconductor chip.

However, the brazing material or the soldering material, which is used to join the ceramic insulating substrate and the heat sink, has a coefficient of thermal expansion which is two-fold or more as compared with those of the ceramic insulating substrate and the heat sink, and a coefficient of thermal conductivity which is not more than 20 W/mK to 70 W/mK. That is, the brazing material or the soldering material has a low value of the coefficient of thermal conductivity which is ½ to 1/7 as compared with those of the ceramic insulating substrate and the heat sink. For this reason, the joining section, at which the brazing material or the soldering material is applied, has a low coefficient of thermal expansion. Further, the joining section undergoes large thermal expansion as compared with other sections. A problem is pointed out that a considerably large stress is generated at the joining section, and the reliability of joining is lowered.

Moreover, it is also feared that the heat tends to be accumulated in the joining section, and it is impossible to effectively exhibit the function of the heat sink. Therefore, it is necessary to provide a considerably large heat sink and a considerably large radiating fin so that a large thermal gradient is always maintained. As a result, a problem arises in that such an arrangement cannot respond to the requirement of miniaturization.

Additionally, the following problems arise. That is, the operation performance of the circuit is deteriorated as the temperature is raised. For example, there are caused deterioration of the transistor function such as the delay of switching speed and the decrease in current and voltage magnification. Further, circuit breakdown occurs due to thermal runaway, and there are caused, for example, peeling at the joining section and peeling of the mounted chip due to heat.

SUMMARY OF THE INVENTION

A general object of the present invention is to provide a functionally gradient member and a method for producing the same having high joining reliability and high thermal conductivity, in which a metal and a ceramic are integrated into one unit without providing any joining section.

A principal object of the present invention is to provide a functionally gradient member and a semiconductor circuit substrate based on the use of the same having high joining reliability and high thermal conductivity without involving any boundary thermal conduction, in which a heat sink or a heat sink base and a ceramic insulating substrate are integrated into one unit.

According to the present invention, at first, a first powder comprising a major component of metal is prepared, on which a second powder comprising major components of ceramic nitride, carbon, and metal is laminated to obtain a compact by means of a simultaneous molding treatment. After that, nitriding is performed for the compact concurrently with thermal calcination or thermal sintering in parallel to one another.

During this process, the temperature region for the metal part is made identical with that for the ceramic part during a densifying stage in the sintering so that added elements are diffused to both of the ceramic part and the metal part. Thus, the composition and the physical properties are smoothly changed from the metal part to the ceramic part or from the ceramic part to the metal part.

Accordingly, it is possible to minimize the stress generated during the production process and the usage process, and thus the reliability can be improved. Further, there is no joining layer such as those formed by brazing and soldering, and there is no section at which the coefficient of thermal conductivity is rapidly changed. Therefore, the heat, which is generated by the circuit provided on the ceramic insulating substrate, is efficiently transferred toward the metal part composition layer. Thus, the thermal stability and the reliability of the circuit are effectively improved.

Metal Part Composition

Metallic aluminum is used because it is excellent in heat conductivity. Metallic aluminum has a melting point of about 660° C. Nitriding is not advanced at a temperature below this temperature, and it becomes impossible to form any aluminum nitride layer having insulation performance and high thermal conductivity. Therefore, it is necessary to raise the melting point of metallic aluminum to the nitriding region or the sintering temperature region for aluminum nitride. A predetermined additive is used in order to achieve this object.

Specifically, those applicable as the additive include, for example, tungsten (W), vanadium (V), molybdenum (Mo), zirconium (Zr), chromium (Cr), iron (Fe), nickel (Ni), and cobalt (Co). Further, for example, it is preferable to add, as an auxiliary additive, a small amount of silver (Ag), magnesium (Mg), silicon (Si), manganese (Mn), and lithium (Li).

When tungsten is added to metallic aluminum, a co-existing area of the solid phase and the liquid phase begins to appear at a temperature not less than the melting point of the metallic aluminum. Intermetallic compounds such as $WAl_2$, $WAl_5$, and $WAl_4$ are produced at temperatures of 1160° C., 1320° C., and 1420° C. or in the vicinity thereof respectively.

When the amount of addition of tungsten is set to be 30 atomic %, the melting point is not less than 1700° C. Thus, a temperature, at which the simultaneous sintering can be performed, is obtained, for example, when aluminum nitride is selected for the ceramic part. However, it is difficult to stably produce metallic aluminum, because it tends to evaporate at a high temperature. Therefore, in order to solve such a problem, it is necessary to use another additive. For example, when lithium, magnesium, silicon, manganese, chromium, iron, nickel, and/or cobalt is added, the evaporation of metallic aluminum at the high temperature is mitigated or avoided. These additives are also required to efficiently perform the reaction between metallic aluminum and tungsten.

Ceramic Part Composition

Since the metal part is not melted even when the temperature is raised to the sintering temperature region for the ceramic, for example, it is conceived that yttrium oxide, calcium oxide, or barium carbonate as an ordinary sintering additive is added to the aluminum nitride material powder to perform sintering. However, in such a case, for example, breakage and deformation notably appear in the sintered compact because of different temperature regions for the densifying process. That is, the metal part is contracted at the aforementioned temperature, for example, 1160° C. and 1320° C. On the contrary, contraction of the ceramic part scarcely occurs, because the densification and the contraction start at a temperature of not less than 1450° C. for the ceramic part. As a result, the ceramic part composition layer is destroyed by the generated boundary stress.

Accordingly, it is necessary that the temperature region during contraction and the reaction temperature region for the metal part are made identical with those for the ceramic part. Therefore, the following artifice is adopted. That is, initially, the material is not added as ceramic for the ceramic part, but the material is converted into ceramic by utilizing the atmosphere and the additive. Thus, an identical reaction temperature region and an identical contraction temperature region are provided to minimize the stress which would be otherwise generated during the sintering.

In such a process, the nitriding temperature, which is used in the conventional method for producing aluminum nitride, is 1400° C. to 1700° C. in the case of direct nitriding for metallic aluminum, and 1450° C. to 1750° C. in the case of reducing nitriding for aluminum oxide ($Al_2O_3$). In any case, it is difficult to perform nitriding while conducting substantial simultaneous sintering. For example, the nitriding process for metallic aluminum proceeds in a way of self-combustion reaction, in which there is a fear that even the reaction temperature cannot be controlled.

Accordingly, attention is directed to the energy of formation of the substance. At first, the material is allowed to contain at least one nitride which has stability of energy of formation lower than that of aluminum nitride as the product, and at least one metal which has stability of energy of formation higher than that of aluminum nitride. By doing so, the reaction start temperature point for nitriding can be lowered, and nitriding can be performed while making control to some extent, not rapidly as otherwise performed in the self-combustion. Specifically, in consideration of the relationship between the temperature and the standard energy of formation concerning the Ellingham diagram, a substance, which has an energy higher than the aluminum nitride line, is added as the nitride, while a substance, which has an energy lower than the aluminum nitride line, is added as the metal.

Specifically, those applicable as the nitride include, for example, nitrides of Mo, Li, Mn, Si, Mg, La, Ta (tantalum), V, B, Cr, Fe, Co, Ni, and Ba (barium). Those applicable as the metal include, for example, Ti, Zr, Hf (hafnium), and Th (thorium). Besides, substantially all carbides exchangeable for the nitrides are applicable, and for example, oxides of Zr and Ti as well as lanthanum series elements are applicable in place of the metals described above.

The characteristics required as the ceramic to be produced include, for example, insulation performance as well as low dielectric property, and bending strength of about 200 MPa. Almost all of the nitrides and carbides, which have been added or converted into ceramic, have conductivity. Therefore, if the value of conductivity is assumed to be, for example, 100 MΩ, it is necessary that the total amount of the conductive ceramic is set to be not more than 40%, because of the following reason. That is, if the ceramic exists in an amount exceeding the above, then the resistance is decreased, the current flows, and the circuit construction cannot be achieved.

From a viewpoint of the low dielectric property, SiC and the transition metal such as Fe, Co, and Ni have the dielectric property. Therefore, it is necessary that the total amount of these metals is set to be not more than 20% in order to make the dielectric constant to be not more than 10 at 1 MHz.

On the other hand, the nitrides and the carbides of, for example, elements of the iron group have low thermodynamic stability. Therefore, these compounds should be added to the ceramic part in an amount of not more than 1%, or these compounds should not be added thereto. However, from a viewpoint of the nitriding for metallic aluminum, the element such as Fe and Ni behaves as a carrier for nitrogen, making it possible to reliably nitride inner portions of particles. Therefore, the addition of the element of the iron group is necessary for the nitriding, however, such an element is ultimately unnecessary. In order to bring out the maximum efficiency by using a minimum amount, it is desirable that such an element is added in an amount of several tens ppm to several hundreds ppm in a form of solution, for example, in a form of nickel nitride and cobalt ethoxide.

The additive element and the additive to be added to the ceramic part include at least one selected from nitrides and carbides of magnesium, lithium, tungsten, niobium (Nb), manganese, chromium, tantalum, and silicon, and carbides of hafnium, zirconium, and lanthanum series elements, and at least one selected from lanthanum series elements including cerium (Ce), zirconium, titanium, and thallium (Tl).

When the metal part and the ceramic part are molded and integrated into one unit, the molding density of each of them involves dispersion. For example, when metallic aluminum is added as the metal part, then the rigidity and the strength of the aluminum component are small in consideration of the general molding pressure of 80 MPa to 250 MPa for the powder, and plastic deformation occurs during the molding. For this reason, it is not adequate to obtain all aluminum nitride by nitriding metallic aluminum. Instead, the following technique is adopted. That is, aluminum nitride is previously added in conformity with the grain size and the distribution of metal and ceramic particles to be used so that densification is advanced during the reaction.

The functionally gradient member according to the present invention includes, in an integrated manner, the metal part composition layer for constructing the heat sink or the heat sink base, and the ceramic part composition layer for constructing the ceramic insulating substrate. Aluminum nitride, which has characteristics such as high thermal conductivity, high insulation performance, and low dielectric property, is used for the ceramic part composition layer. On the other hand, a copper alloy such as a copper-tungsten alloy and a copper-molybdenum alloy, which has high thermal conductivity and high rigidity required for the heat sink or the heat sink base, is used for the metal part composition layer. The material is not limited to thereto provided that the material undergoes small thermal expansion, and it can sufficiently construct the functionally gradient member. The material may be copper alloys such as copper-vanadium, niobium, tantalum, and chromium.

The functionally gradient layer, in which the composition of ceramic and metal is gradually changed, is integrally formed between the ceramic part composition layer and the metal part composition layer. Accordingly, the composition and the characteristics are smoothly changed from the ceramic part composition layer to the metal part composition layer, in which there is no joining section. Therefore, no boundary thermal conduction occurs between the heat sink or the heat sink base and the ceramic insulating substrate. The heat transfer resistance can be minimized as small as possible, the heat radiation performance is excellent, and the thermal reliability is improved.

The coefficient of thermal expansion of the metal part composition and the coefficient of thermal expansion of the ceramic part composition can be changed by selecting the respective compositions. That is, Table 1 shows the change of the coefficient of thermal expansion obtained when the composition ratio is changed based on the use of combinations of tungsten and copper (W—Cu) and molybdenum and copper (Mo—Cu) as the metal part composition respectively.

TABLE 1

| Metal part composition | Coefficient of thermal expansion × $10^{-6}$/k |
|---|---|
| 75 W-25 Cu | 9.6 |
| 80 W-20 Cu | 8.3 |
| 85 W-15 Cu | 7.2 |
| 90 W-10 Cu | 6.3 |
| 80 Mo-20 Cu | 8.0 |
| 85 Mo-15 Cu | 7.0 |
| 90 Mo-10 Cu | 6.5 |

On the other hand, as shown in Table 2, the coefficient of thermal expansion of the ceramic part composition can be changed by using and changing the composition ratio of the metallic aluminum, aluminum nitride, and other additives as the ceramic part composition respectively.

TABLE 2

| Ceramic part composition | Coefficient of thermal expansion × $10^{-6}$/k |
|---|---|
| AlN | 4.4 |
| 10 Al-85 AlN-5 (others) | 7.4 |
| 5 Al-92 AlN-3 (others) | 6.5 |
| 15 Al-80 AlN-5 (others) | 9.4 |
| 20 Al-72 AlN-8 (others) | 12.8 |

The average coefficient of thermal conductivity of the functionally gradient member described above arrives at 200 W/mK or more, making it possible to obtain excellent thermal conductivity. The coefficient of thermal expansion of the ceramic part composition has a value equivalent to those of ordinary used ceramic insulating substrates, making it possible to effectively maintain the reliability upon mounting of the semiconductor chip. Further, for example, simultaneous metallization can be performed with tungsten and molybdenum, and thus the reliability is more improved.

Next, a conductor pattern is formed on the ceramic part composition layer of the functionally gradient member, the semiconductor chip is mounted, and electrodes are formed. During this process, for example, the copper metallization is performed as follows. That is, a conductor pattern is printed or a copper foil is allowed to adhere on the surface of the functionally gradient member, and then a heat treatment is carried out at about 1000° C. to form the copper metallization. The metal part composition layer of the functionally gradient member is composed of the copper alloy having a melting of not less than 1000° C., which is sufficiently applicable to this process.

Metallization with tungsten and molybdenum, in which the thermal expansion of the conductor portion is small, is sometimes used to improve the reliability of the semiconductor circuit and control large electric power. In such a case, the following procedure may be applicable. That is, the conductor pattern is formed, for example, by means of printing at the preforming stage before constructing the functionally gradient member, and metallization is performed in the process to make advance to the functionally gradient member, namely, in the production process.

For example, it is assumed that an IGBT circuit is constructed in the same manner as the conventional system. The thickness of the ceramic part composition layer for constructing the functionally gradient member and the thickness of the metal part composition layer disposed on the side of the heat sink are set to be identical with those of the conventional system. Subsequently, the average coefficient of thermal conductivity and the transient heat resistance are measured. As a result, an effect is obtained in that the average coefficient of thermal conductivity is improved to be about two-fold as compared with the conventional system, and the transient heat resistance is improved to be about 1/10 as compared with the conventional system.

Accordingly, the functionally gradient member of the present invention can be applied, for example, to IGBT and GTO of power control transistors, SCR and FET of high powder transistors, and QFP for high speed control circuits, having been hitherto difficult to give a compact size and a high capacity due to the problem of heat-radiating performance. Therefore, the performance obtained in these applications can be remarkably improved.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

In the first embodiment of the present invention, at first, a ceramic part was prepared by mixing a metallic aluminum powder having an average particle diameter of 3μm, a metallic tungsten powder having an average particle diameter of 0.6μm, and a metallic cobalt powder having an average particle diameter of 0.6 μm, in amounts of 26.5 wt %, 73 wt %, and 0.5 wt % respectively. After that, alcohol was added to 100 parts of an obtained powder, in an amount to give 10 wt %. Thus, a first mixed powder A was obtained.

A part to be converted into ceramic was prepared by mixing a metallic aluminum powder having an average particle diameter of 3 μm, a tungsten carbide powder having an average particle diameter of 0.6 μm as one existing above the aluminum nitride line in the Ellingham diagram, a molybdenum nitride ($Mo_2N$) powder having an average diameter of 1.2 μm, a metallic zirconium powder having an average particle diameter of 2.4 μm as a metal existing below the aluminum nitride line in the Ellingham diagram as well, and other materials including carbon black, an aluminum nitride powder having an average particle diameter of 1.2 μm, and a metallic nickel powder having an average particle diameter of 0. 1 μm, in amounts of 60 wt %, 3.0 wt %, 2.0 wt %, 3.0 wt %, 1.9 wt %, 30 wt %, and 0.1 wt % respectively. After that, alcohol was added to 100 parts of an obtained powder, in an amount to give 15 wt %. Thus, a second mixed powder B was obtained.

Subsequently, the first mixed powder A was weighed so that the metal part after the sintering had a thickness of 4 mm and a size of 50×50 mm. After that, the first mixed powder A was charged into a mold for pressure molding, and the first mixed powder A was flattened only by using the weight of the punch. The second mixed powder B was weighed so that the entire thickness after the sintering was 6 mm, which was laminated on the flattened first mixed powder A.

The molding pressure was set to be 120 MPa. The first and second mixed powders A, B were subjected to a molding treatment in accordance with the isostatic pressing molding method to obtain a compact. Excessive alcohol, which appeared during the molding process, was discharged through the gas of the mold to minimize alcohol remaining in the compact. The remaining amount of alcohol was substantially 5 wt %.

Figure 1A:
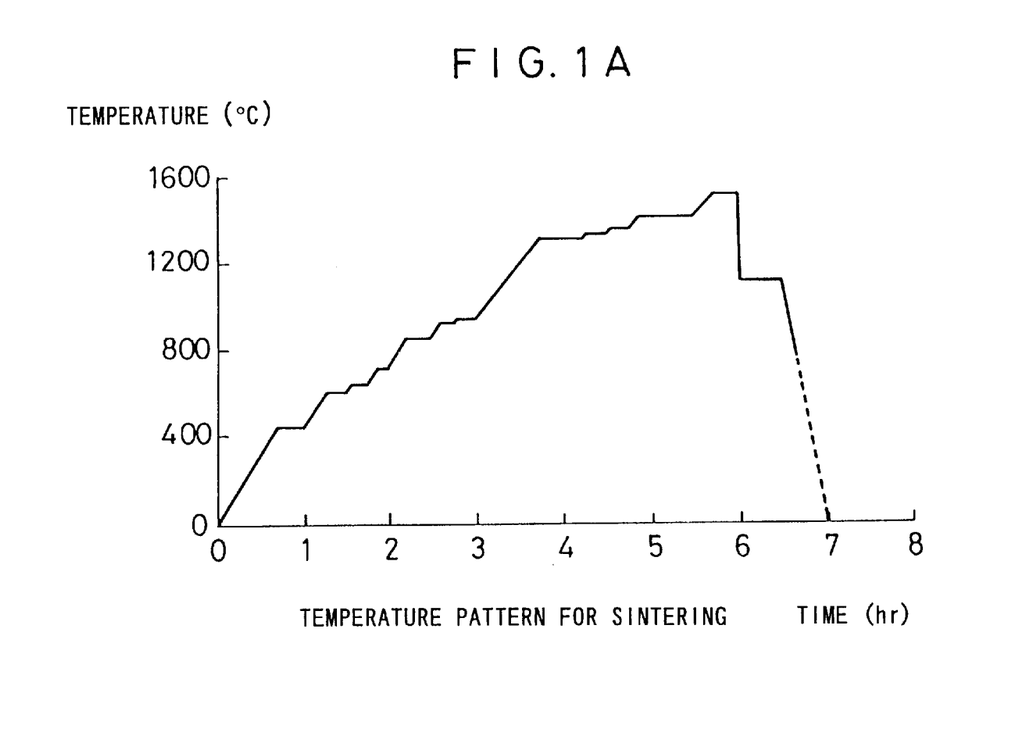
FIG. 1A illustrates a temperature pattern for sintering, used in a production method according to a first embodiment of the present invention.
Figure 1B:
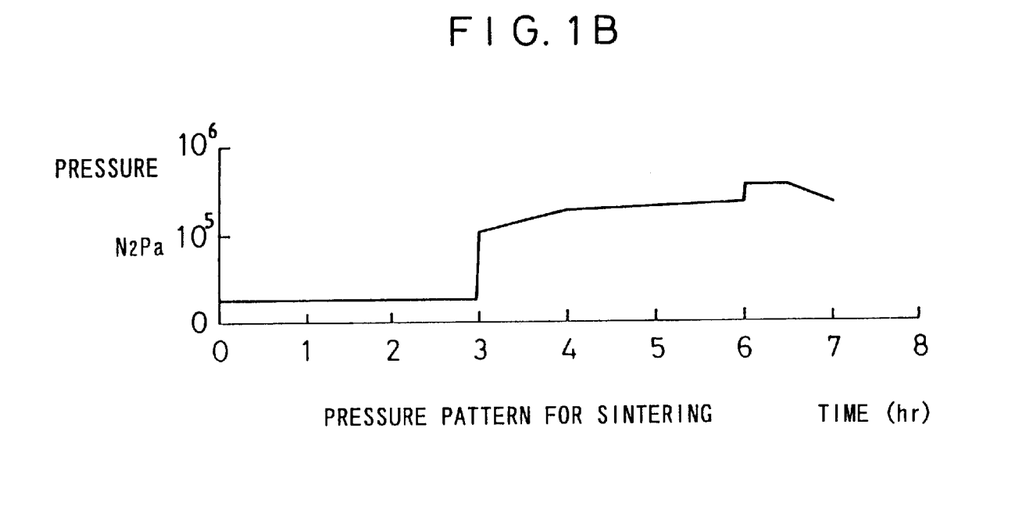
FIG. 1B illustrates a pressure pattern for sintering.

After that, the compact was subjected to a drying treatment at 40° C. for 2 hours to prevent oxidation. Subsequently, the compact was transferred to a controlled atmosphere furnace, and it was heated and sintered in a nitrogen atmosphere. In order to avoid occurrence of warpage during the sintering, an h-BN plate of about 15 g was placed on the compact to apply the sintering treatment. The sintering pattern resided in the condition shown in FIG. 1A and FIG. 1B. Densification for the metal part was carried out, and the temperature was constantly held at the point of change associated with the change in crystalline structure or in the vicinity thereof. Further, the nitrogen pressure was controlled as well to continuously and effectively perform the nitriding.

Figure 2:
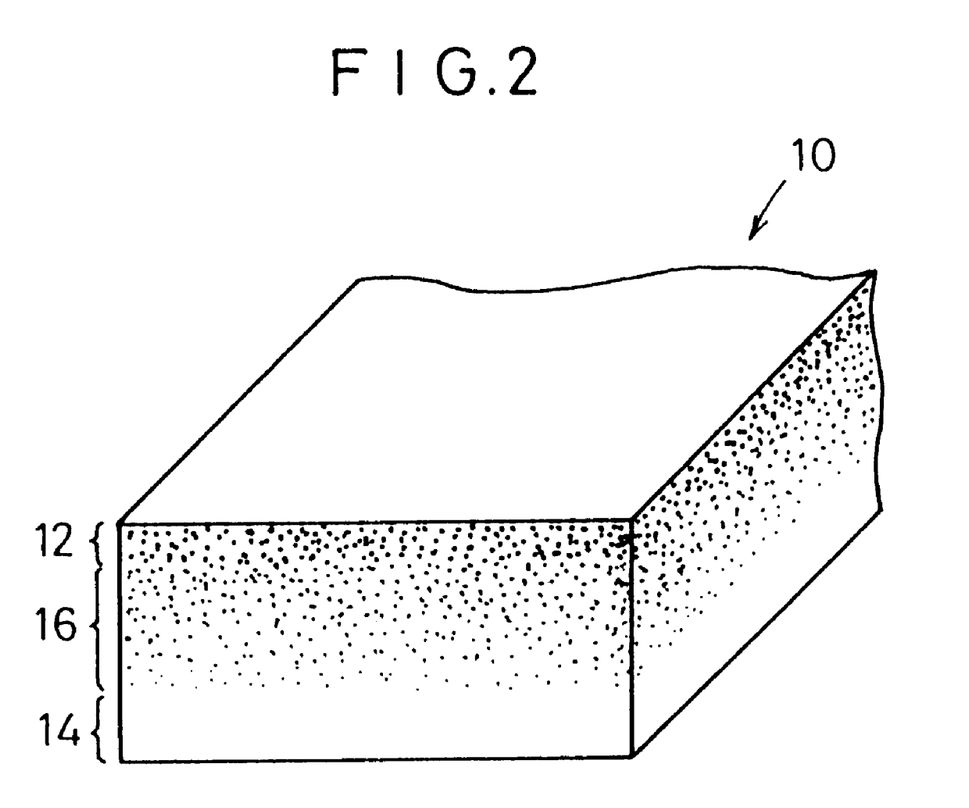
FIG. 2 shows a perspective view illustrating a part of a sintered compact obtained by the production method.

Accordingly, as shown in FIG. 2, a functionally gradient member 10 as a sintered compact was obtained. The functionally gradient member 10 is constructed in an integrated manner by a ceramic part composition layer 12, a metal part composition layer 14, and a composite composition layer 16 disposed at the boundary portion between the ceramic part composition layer 12 and the metal part composition layer 14.

Almost all of the surface of the ceramic part composition layer 12 was composed of the nitride, and the surface of the metal part composition layer 14 was completely in a metal state. Further, it was impossible to identify any interface between the ceramic and the metal in the composite composition layer 16. Thus, the desired functionally gradient member was obtained. The functionally gradient member 10 included no apparent defect such as breakage and cracks at all, which would otherwise appear due to the difference, for example, in contraction amount and contraction temperature between the ceramic composition and the metal composition. The withstand voltage of the surface of the ceramic part composition layer 12 was not less than 1 GV. The resistance of the metal part composition layer 14 disposed on the opposite side had a value which was almost immeasurable. As for the coefficient of thermal conductivity, a value of not less than 170 W/mK was obtained as a whole.

Figure 3:
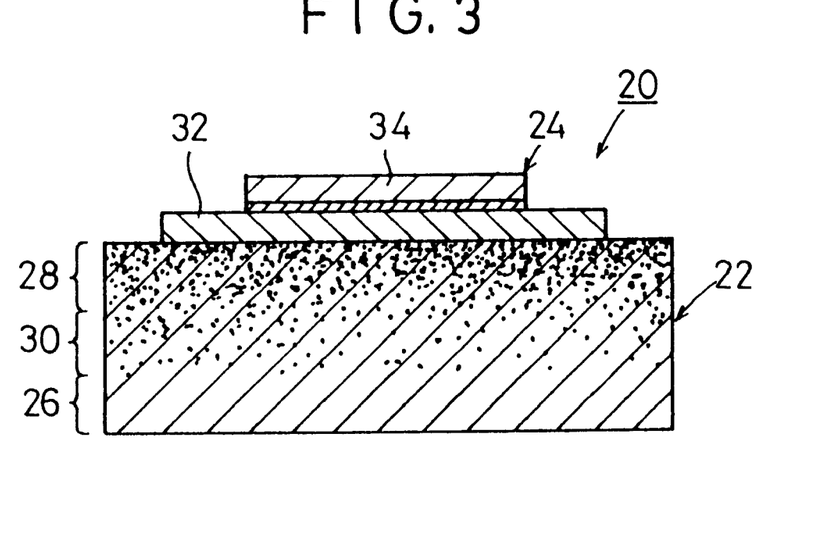
FIG. 3 generally illustrates a semiconductor circuit substrate according to a second embodiment of the present invention.

FIG. 3 illustrates the outline of a semiconductor circuit substrate 20 based on the use of a functionally gradient member 22 according to a second embodiment of the present invention. The semiconductor circuit substrate 20 included the functionally gradient member 22 and a semiconductor circuit 24 formed on the functionally gradient member 22.

The functionally gradient member 22 was constructed in an integrated manner by a metal part composition layer 26 for constructing a heat sink, a ceramic part composition layer 28 for constructing a ceramic insulating substrate, and a composite composition layer 30 disposed at the boundary portion between the metal part composition layer 26 and the ceramic part composition layer 28.

The ceramic part composition layer 26 was composed of a major component of copper-tungsten alloy. The ceramic part composition layer 28 was composed of a major component of aluminum nitride. In the composite composition layer 30, any interface was unidentifiable owing to the mutual diffusion of the ceramic and the metal. A copper-metallized layer 32 was provided on the surface of the ceramic part composition layer 28 of the functionally gradient member 22. Nickel plating was applied to the metallized layer 32. After that, a semiconductor chip 34 such as S1 chip and GaAs chip was soldered as a semiconductor circuit 24.

Figure 4:
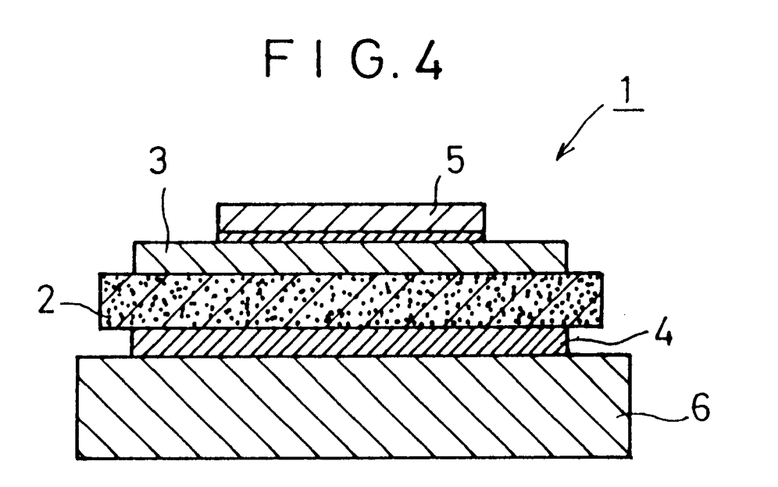
FIG. 4 generally illustrates a conventional semiconductor circuit substrate.

A conventional semiconductor circuit substrate 1 shown in FIG. 4 was used as an illustrative comparative sample. The semiconductor circuit substrate 1 and the semiconductor circuit substrate 20 according to the second embodiment were used to perform an experiment for measuring the transient heat resistance (resistance of heat transfer) and the average coefficient of thermal conductivity of each of them.

The conventional semiconductor circuit substrate 1 included a ceramic insulating substrate 2 having a thickness of 0.635 mm. First and second metallized layer 3, 4 of copper, which were set to have thicknesses of 0.3 mm and 0.25 mm respectively, were provided on both surfaces of the ceramic insulating substrate 2. Nickel plating was applied to the first metallized layer 3, and then a semiconductor chip 5 was joined thereon with solder. On the other hand, nickel plating was applied to the second metallized layer 4 in the same manner as described above, and then a heat sink 6 made of copper was joined with solder.

In the semiconductor circuit substrate 20 according to the second embodiment, the ceramic part composition layer 28 had a thickness of 0.6 mm, and the composite composition layer 30 had a thickness of 1.5 mm. The functionally gradient member 22 had an entire thickness which was set to be identical with the thickness obtained after joining the heat sink 6 to the conventional ceramic insulating substrate 2. A copper-metallized layer 32 having a thickness of 0.3 mm was provided on the surface of the ceramic part composition layer 28. Nickel plating was applied to the surface of the metallized layer 32. After that, a semiconductor chip 34 was joined with solder.

Figure 5:
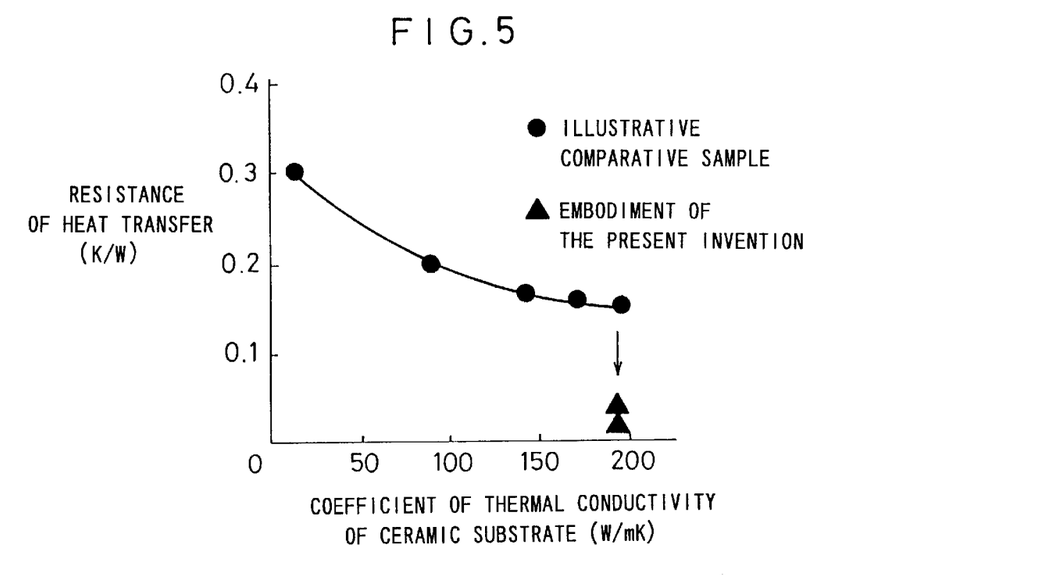
FIG. 5 shows a relationship between the coefficient of thermal conductivity and the resistance of heat transfer of the ceramic insulating substrate.
Figure 6:
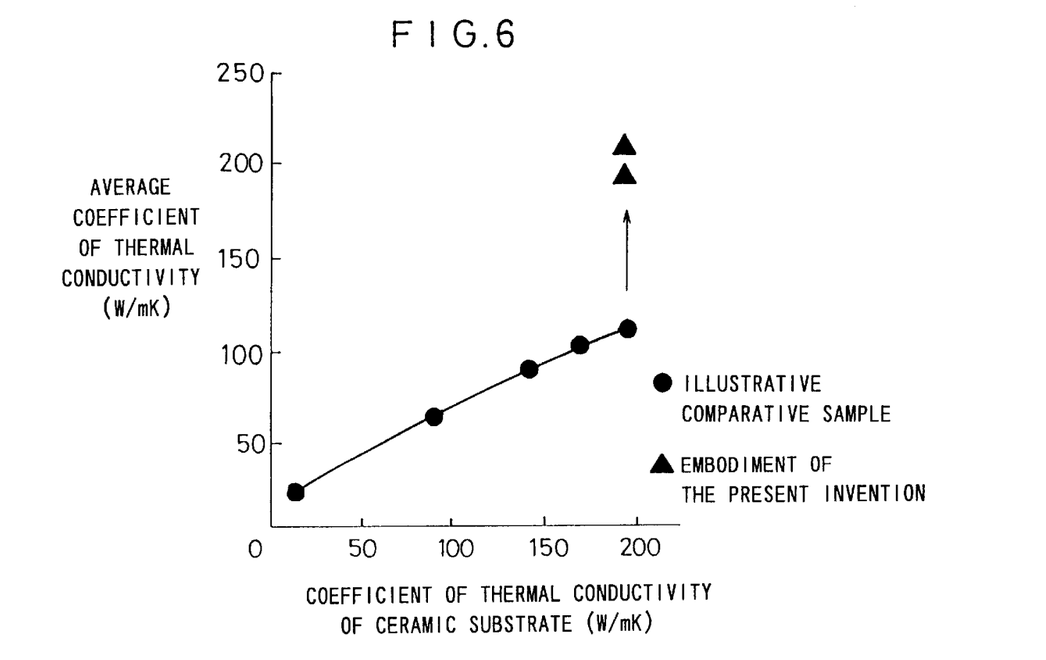
FIG. 6 shows a relationship between the coefficient of thermal conductivity and the average coefficient of thermal conductivity of the ceramic insulating substrate.

The semiconductor circuit substrate 20 according to the second embodiment and the conventional semiconductor circuit substrate 1 were used to measure the transient heat resistance and the average coefficient of thermal conductivity of each of them were measured at 45° C. considered to be a turning point to cause deterioration of performance of the semiconductor circuit. Obtained results are shown in FIGS. 5 and 6. Comparison was made for the conventional semiconductor circuit substrate 1 by using those having various different coefficients of thermal conductivity, such as those made of alumina and aluminum nitride, as the ceramic insulating substrate 2.

According to the measurement, in the case of the conventional semiconductor circuit substrate 1, the transient heat resistance (heat transfer resistance) was decreased to 0.3 to 0.16 K/W in accordance with the increase in coefficient of thermal conductivity of the ceramic insulating substrate 2. However, the degree of the decrease was reduced in a range in which the coefficient of thermal conductivity of the ceramic insulating substrate 2 exceeded 150 W/mK. It h as been revealed that the relationship between the transient heat resistance and the coefficient of thermal conductivity of the ceramic insulating substrate 2 has a tendency to cause saturation at 200 W/mK.

On the contrary, in the case of the semiconductor circuit substrate 20 according to the second embodiment, the transient heat resistance was decreased all at once to 0.006 to 0.01 K/W, and it was reduced to be not more than ¹⁄₁₀ of that of the conventional semiconductor circuit substrate 1.

As for the average coefficient of thermal conductivity, in the case of the conventional semiconductor circuit substrate 1, when the coefficient of thermal conductivity of the ceramic insulating substrate 2 was increased, the average coefficient of thermal conductivity was also gradually increased. However, even in the case of the ceramic insulating substrate 2 having a coefficient of thermal conductivity of 200 W/mK, the average coefficient of thermal conductivity was merely in a degree of 120 W/mK, because of the following reason. That is, extremely large influence was exerted thereon, for example, by solder. In the same manner as the transient heat resistance, the relationship between the coefficient of thermal conductivity and the average coefficient of thermal conductivity of the ceramic insulating substrate 2 had a tendency to cause saturation at 200 W/mK.

On the contrary, in the case of the semiconductor circuit substrate 20 according to the second embodiment, the average coefficient of thermal conductivity was 190 to 220 W/mK, providing a value approximate to the double of the maximum value obtained for the illustrative comparative sample.

That is, in the case of the conventional semiconductor circuit substrate 1, the boundary heat transfer occurred due to the presence of the joining section composed of solder for joining the heat sink 6 to the ceramic insulating substrate 2 even when copper having high thermal conductivity was used as the heat sink 6.

On the other hand, in the case of the semiconductor circuit substrate 20 according to the second embodiment, the metal part composition layer 26 as the copper-tungsten alloy was provided as the heat sink integrally for the functionally gradient member 22. Therefore, the joining section composed of solder, which would cause the boundary heat transfer, did not exist. Thus, the heat transfer resistance was successfully reduced all at once to make the average coefficient of thermal conductivity to be about twice, making it possible to greatly contribute to the improvement in performance of the semiconductor chip 34 and effectively improve the thermal reliability.

Therefore, according to the second embodiment, the following effect is obtained. That is, it is possible to contemplate the compact size, the excellent function, the large capacity, and the high speed of the semiconductor circuit, and the functionally gradient member can be effectively used, for example, for IGBT, QFP, FET, GTO, and SCR, having been difficult to make application in ordinary cases due to the problem of heat-radiating performance.

In the second embodiment, the metal part composition layer 26 was provided as the heat sink for the semiconductor circuit substrate 20. However, a heat sink base may be constructed in place of the heat sink. The metal part composition layer 26 comprised the major component of the copper-tungsten alloy. Alternatively, an equivalent effect can be obtained even when a copper-molybdenum alloy is used as a major component.

Figure 7:
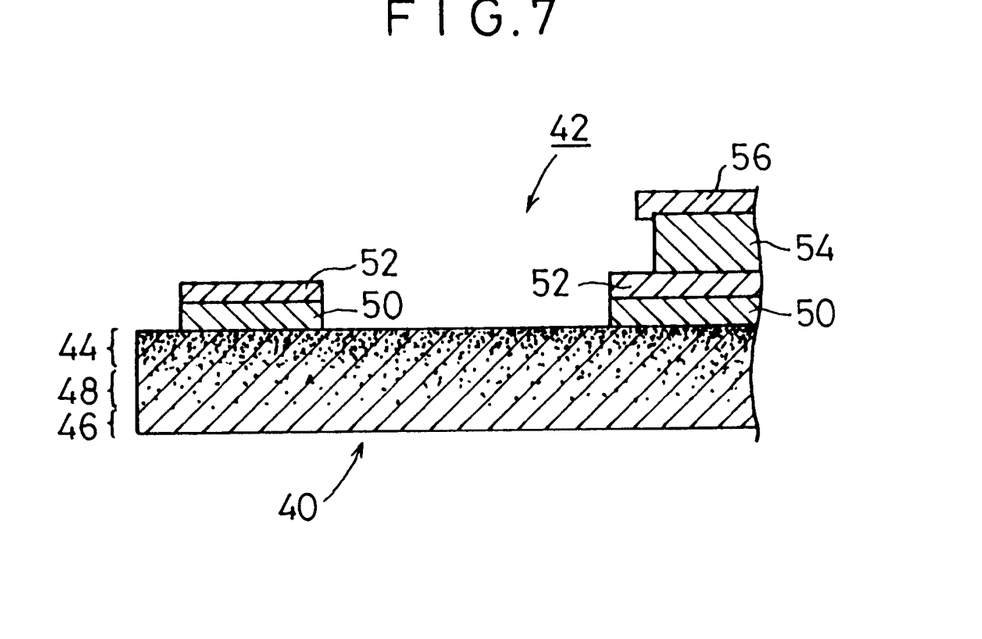
FIG. 7 shows a partial longitudinal sectional view illustrating a semiconductor circuit substrate based on the use of a functionally gradient member according to a third embodiment of the present invention.

FIG. 7 illustrates the outline of a semiconductor circuit substrate 42 based on the use of a functionally gradient member 40 according to a third embodiment of the present invention.

The functionally gradient member 40 was constructed in an integrated manner by a ceramic part composition layer 44 to function as a ceramic insulating substrate, a metal part composition layer 46 to function as a heat sink, and a composite composition layer (functionally gradient layer) 48 provided at the boundary portion between the ceramic part composition layer 44 and the metal part composition layer 46.

The ceramic part composition layer 44 was composed of aluminum nitride, and the metal part composition layer 46 was composed of a copper alloy, for example, a copper-tungsten alloy or a copper-molybdenum alloy. In the composite composition layer 48, the interface was unidentifiable owing to the mutual diffusion of the ceramic and the metal and the gradual change of the composition thereof. The ceramic part composition layer 44 and the composite composition layer 48 were set to have thicknesses of 0.5 mm and 2.5 mm respectively. The functionally gradient member 40 was set to have an entire thickness of 6 mm.

As for the respective physical properties of the functionally gradient member 40 constructed as described above, the average coefficient of thermal conductivity was 220 W/mK, the coefficient of thermal expansion was 6 to $8 \times 10^{-6}$/K, and the insulation performance and the dielectric property of the ceramic part composition layer 44 were not less than 10 GΩ and 8.5 (1 MHz) respectively.

A copper-metallized layer 50 having a thickness of 0.3 mm was provided on the ceramic part composition layer 44 of the functionally gradient member 40. A nickel plating layer 52 of 5 μm was formed on the copper-metallized layer 50. A semiconductor chip (Si chip) 56 was joined to the nickel plating layer 52 by the aid of solder 54.

Subsequently, the semiconductor circuit substrate 42, which was obtained by mounting the semiconductor chip 56 on the functionally gradient member 40, was used to measure the transient heat resistance and measure the average coefficient of thermal conductivity between the semiconductor chip 56 and the metal part composition layer 46. The measuring temperature was set to be 45° C. as the boundary temperature for deterioration of semiconductor characteristics.

Figure 8:
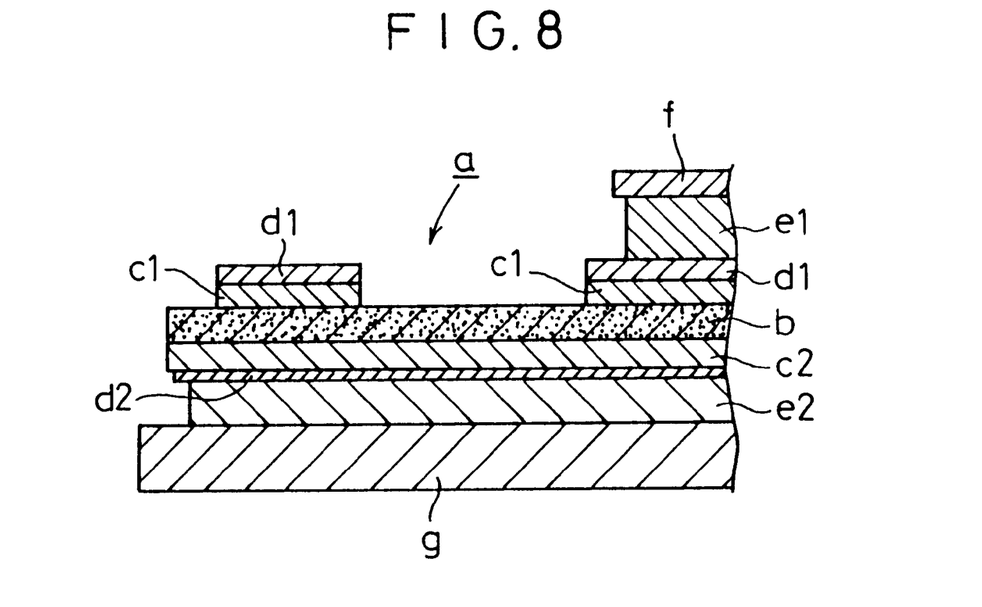
FIG. 8 shows a partial longitudinal sectional view illustrating a DBC substrate having been hitherto used.

In the measurement, as shown in FIG. 8, an IGBT circuit based on the use of a presently used DBC substrate "a" for semiconductors was adopted as an illustrative comparative sample. The DBC substrate "a" was provided with a ceramic insulating substrate "b". The ceramic insulating substrate "b" was composed of aluminum nitride having a coefficient of thermal conductivity of 170 W/mK, with its thickness being set to be 0.635 mm.

A copper-metallized layer C1 having a thickness of 0.3 mm was provided on the ceramic insulating substrate "b" on the side of the semiconductor. On the other hand, a copper-metallized layer C2 having a thickness of 0.25 mm was formed on the side of the heat sink base. A nickel plating layer d1 having a thickness of about 5 μm was provided on the copper-metallized layer C1. A semiconductor chip (Si chip) "f" was joined to the nickel plating layer d1 by the aid of solder e1.

A heat sink base "g" was joined on the side of the copper-metallized layer C2 by the aid of solder e2 and a nickel plating layer d2 having a thickness of about 5 μm in the same manner as described above. The heat sink base "g" was composed of pure copper, having a coefficient of thermal conductivity of 390 W/mK.

An experiment was performed to detect thermal characteristics for each of the DBC substrate "a" of the illustrative comparative sample and the semiconductor circuit substrate 42 based on the use of the functionally gradient member 40 according to the third embodiment. As a result, the transient heat resistance was 0.17 K/W for the DBC substrate "a" and 0.016 K/W for the functionally gradient member 40 according to the third embodiment. Thus, the transient heat resistance was improved to be about 1/10 as compared with the illustrative comparative sample. The average coefficient of thermal conductivity was 110 W/mK for the DBC substrate "a" of the illustrative comparative sample and 200 W/mK for the functionally gradient member 40 according to the third embodiment. Thus, the average coefficient of thermal conductivity was improved to be about twice as compared with the illustrative comparative sample.

Therefore, according to the third embodiment, the following effect is obtained in the same manner as the second embodiment. That is, it is possible to contemplate the compact size, the excellent function, the large capacity, and the high speed of the circuit, and the functionally gradient member can be effectively used, for example, for IGBT, QFP, FET, GTO, and SCR, having been difficult to make application in ordinary cases due to the problem of heat-radiating performance.

What is claimed is:

1. A functionally gradient member comprising:
    a ceramic part composition layer composed of aluminum nitride;
    a metal part composition layer composed of a copper alloy for functioning as a heat sink or a heat sink base, wherein said copper alloy is one of a copper-tungsten alloy or a copper-molybdenum alloy; and
    a composite composition layer in which a composition of said aluminum nitride and said copper alloy is gradually changed, for integrating said ceramic part composition layer and said metal part composition layer into one unit.

2. A semiconductor circuit substrate based on the use of a functionally gradient member, comprising:
    said functionally gradient member; and
    a semiconductor circuit formed on said functionally gradient member, wherein said functionally gradient member comprises, in an integrated manner:
        a metal part composition layer composed of a copper alloy for constructing a heat sink or a heat sink base, wherein said copper alloy is one of a copper-tungsten alloy or a copper-molybdenum alloy; and
        a ceramic part composition layer composed of aluminum nitride for constructing a ceramic insulating substrate.

3. The semiconductor circuit substrate based on the use of said functionally gradient member according to claim 2, comprising a composite composition layer disposed at a boundary portion between said metal part composition layer and said ceramic part composition layer, in which its composition and physical properties are gradually changed.

4. The semiconductor circuit substrate based on the use of said functionally gradient member according to claim 2, wherein said semiconductor circuit has a transient heat resistance of not more than 0.1 K/W at 45° C.

5. The semiconductor circuit substrate based on the use of said functionally gradient member according to claim 2, wherein said semiconductor circuit includes IGBT, QFP, FET, GTO, or SCR.

* * * * *